US012765411B2

(12) United States Patent
Yeo et al.

(10) Patent No.: US 12,765,411 B2
(45) Date of Patent: Oct. 13, 2026

(54) SEMICONDUCTOR DEVICE AND METHOD OF FORMING ENCAPSULATED VERTICAL INTERCONNECT STRUCTURE

(71) Applicant: STATS ChipPAC Pte. Ltd., Singapore (SG)

(72) Inventors: Swain Hong Alfred Yeo, Singapore (SG); Kai Chong Chan, Singapore (SG); Linda Pei Ee Chua, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 346 days.

(21) Appl. No.: 18/587,875

(22) Filed: Feb. 26, 2024

(65) Prior Publication Data

US 2025/0273552 A1 Aug. 28, 2025

(51) Int. Cl.
*H10W 72/00* (2026.01)
*H10W 70/05* (2026.01)
(Continued)

(52) U.S. Cl.
CPC ....... *H10W 72/823* (2026.01); *H10W 70/095* (2026.01); *H10W 70/635* (2026.01); *H10W 74/019* (2026.01); *H10W 70/60* (2026.01)

(58) Field of Classification Search
CPC .... H10P 72/74; H10P 72/716; H10P 72/7448; H10P 72/745; H10W 20/023; H10W 20/0234; H10W 20/0238; H10W 20/0242; H10W 20/0245; H10W 20/0249; H10W 20/0253; H10W 20/0257; H10W 20/0261; H10W 20/0265; H10W 20/0698; H10W 20/20; H10W 20/42; H10W 70/095; H10W 70/614; H10W 70/635; H10W 70/65; H10W 72/823; H10W 74/019; H10W 74/10; H10W 74/117; H10W 90/701; H10W 99/00
See application file for complete search history.

(56) References Cited

U.S. PATENT DOCUMENTS 9,991,190 B2 6/2018 Huang et al.
10,504,845 B2 12/2019 Lin
(Continued)

*Primary Examiner* — Cheung Lee
(74) *Attorney, Agent, or Firm* — Brian M. Kaufman; Robert D. Atkins; Atkins and Associates, P.C.

(57) ABSTRACT

A semiconductor device has a first vertical interconnect substrate and a second vertical interconnect substrate. A first encapsulant is over the first vertical interconnect structure and second vertical interconnect structure. The first vertical interconnect structure is formed over a substrate. The first vertical interconnect structure can be a plurality of stacked vertical conductive posts. An electrical component is disposed between the first vertical interconnect structure and second vertical interconnect structure, or adjacent to the first vertical interconnect structure and second vertical interconnect structure. A second encapsulant is deposited around the electrical component. A portion of the second encapsulant is removed to expose a first surface of the first vertical interconnect structure. The substrate is removed to expose a second surface of the first vertical interconnect structure. A portion of the first encapsulant can be removed to expose a surface of the first vertical interconnect structure.

10 Claims, 18 Drawing Sheets

(51) Int. Cl.

| | |
|---|---|
| ***H10W 70/63*** | (2026.01) |
| ***H10W 74/01*** | (2026.01) |
| *H10W 70/60* | (2026.01) |

(56) References Cited

U.S. PATENT DOCUMENTS

| | | | | |
|---|---|---|---|---|
| 11,769,712 | B2 | 9/2023 | Lee et al. | |
| 11,798,892 | B2 | 10/2023 | Guzek | |
| 2010/0144101 | A1* | 6/2010 | Chow | H10W 74/014<br>257/E21.502 |
| 2014/0175671 | A1* | 6/2014 | Haba | H05K 1/11<br>438/109 |
| 2021/0082824 | A1* | 3/2021 | Yu | H10W 70/65 |
| 2024/0429200 | A1* | 12/2024 | Lin | H10W 74/117 |

* cited by examiner

SEMICONDUCTOR DEVICE AND METHOD OF FORMING ENCAPSULATED VERTICAL INTERCONNECT STRUCTURE

FIELD OF THE INVENTION

The present invention relates in general to semiconductor devices and, more particularly, to a semiconductor device and method of forming an encapsulated vertical interconnect structure.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor wafer typically contains a plurality of semiconductor die separated by a saw street. The semiconductor wafer is singulated into a plurality of individual semiconductor die. A semiconductor package may contain a semiconductor die mounted to an interconnect substrate or structure. The interconnect structure should provide vertical interconnect capability for the semiconductor die, sometimes to a significant height. The stacking of vias to form a high vertical interconnection can lead to irregular shapes and sizes of the vias, reduce manufacturing yield, high warpage, and increase defects. The vertical interconnect structure can have a limited height to diameter ratio, reducing interconnect density.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
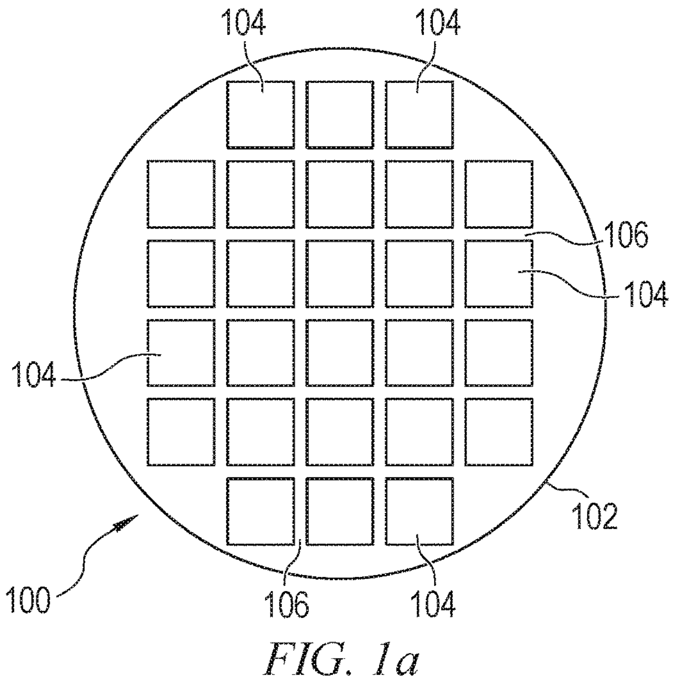
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
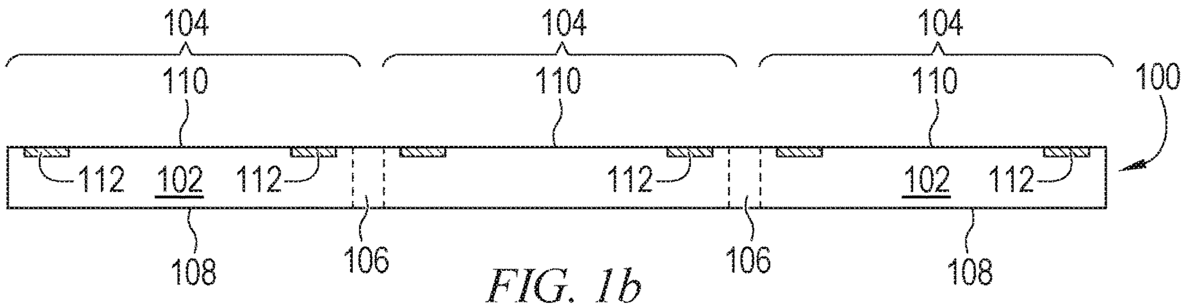

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
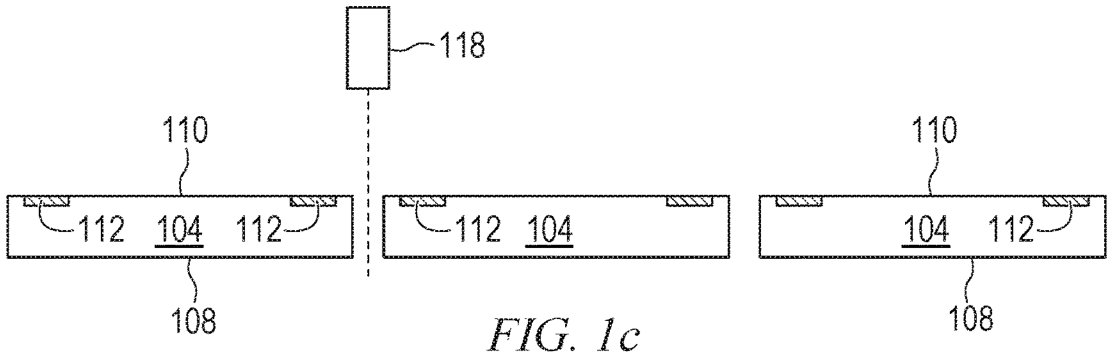

In FIG. 1*c*, semiconductor wafer 100 is singulated through saw street 106 using a saw blade or laser cutting tool 119 into individual semiconductor die 104. The individual semiconductor die 104 can be inspected and electrically tested for identification of known good die or unit (KGD/KGU) post singulation.

Figures 2A, 2B, 2C:
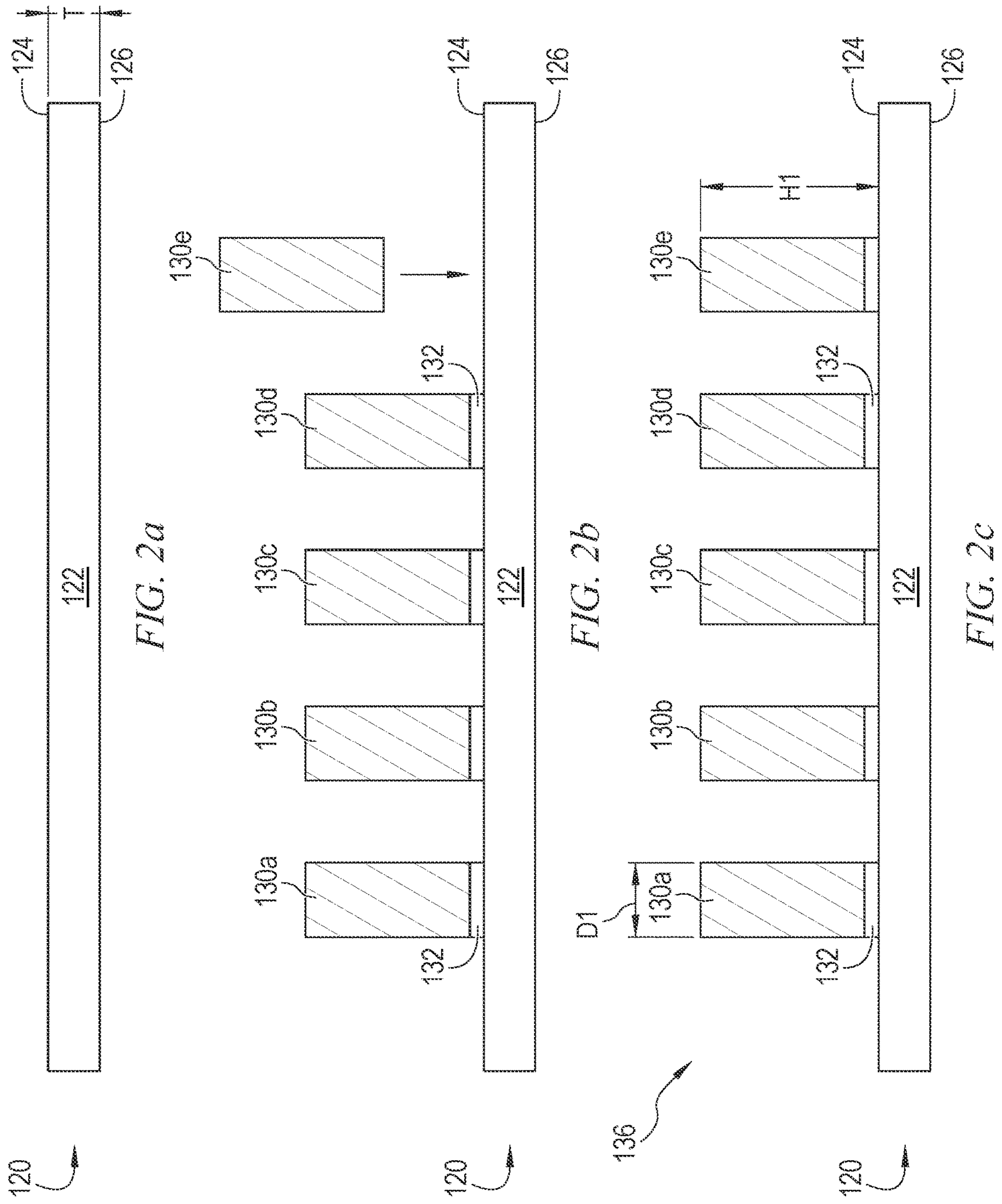
FIGS. 2*a*-2*g* illustrate a process of forming an encapsulated vertical interconnect structure.

FIGS. 2*a*-2*g* illustrate a process of forming an encapsulated vertical interconnect structure. FIG. 2*a* shows a temporary substrate 120 made with base material 122 as a multi-layer flexible laminate, ceramic, copper clad laminate (CCL), glass, or epoxy molding compound. Base material 122 can contain one or more layers of SiO2, Si3N4, SiON, Ta2O5, Al2O3, solder resist, polyimide, BCB, PBO, and other material having similar insulating and structural properties. Substrate 120 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Substrate 120 can be silicon, germanium, aluminum phosphide, aluminum arsenide, gallium arsenide, gallium nitride, indium phosphide, silicon carbide, or other bulk material for structural support. In another embodiment, substrate 120 can also be any suitable laminate interposer, PCB, wafer-form, strip interposer, leadframe, or other type of substrate. Substrate 120 has a thickness T of 100 μm or more micrometers (μm) and includes first major surface 124 and second major surface 126 opposite surface 124.

In FIG. 2*b*, electrically conductive posts or pillars or columns 130*a*, 130*b*, 130*c*, 130*d*, and 130*e* are formed on surface 124. Conductive posts 130*a*-130*e* can be one or more layers of Al, Cu, Sn, Ni, Au, Ag, or other suitable electrically conductive material. In one embodiment, conductive posts 130*a*-130*e* are attached to substrate 120 with conductive paste or solder 132. Bonding material 132 can also be a conductive or non-conductive adhesive thin-film or die attach film (DAF) to form a vertically standing structure of conductive posts 130*a* to 130*e* on surface 124 of substrate 120. FIG. 2*c* shows conductive posts 130*a*-130*e* attached to substrate 120 as vertical interconnect structure 136. In one embodiment, conductive posts 130*a*-130*e* have a height H1 of about 100 μm and diameter D1 of 50 μm, depending on the desired pitch manufacturing process.

Figure 3A:
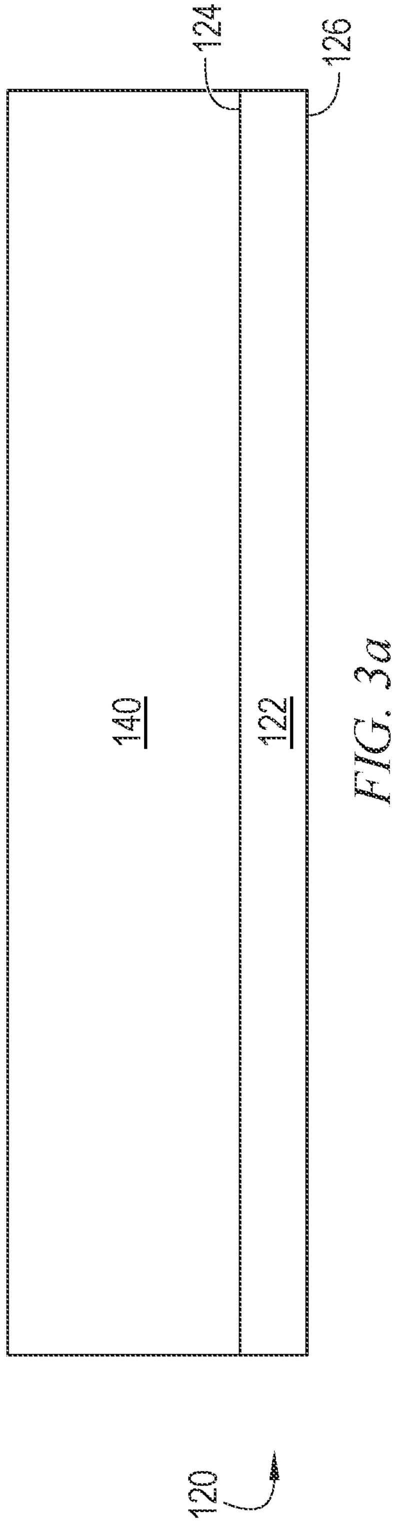
FIGS. 3*a*-3*d* illustrate an alternate process of forming a vertical interconnect structure for encapsulation.
Figure 3B:
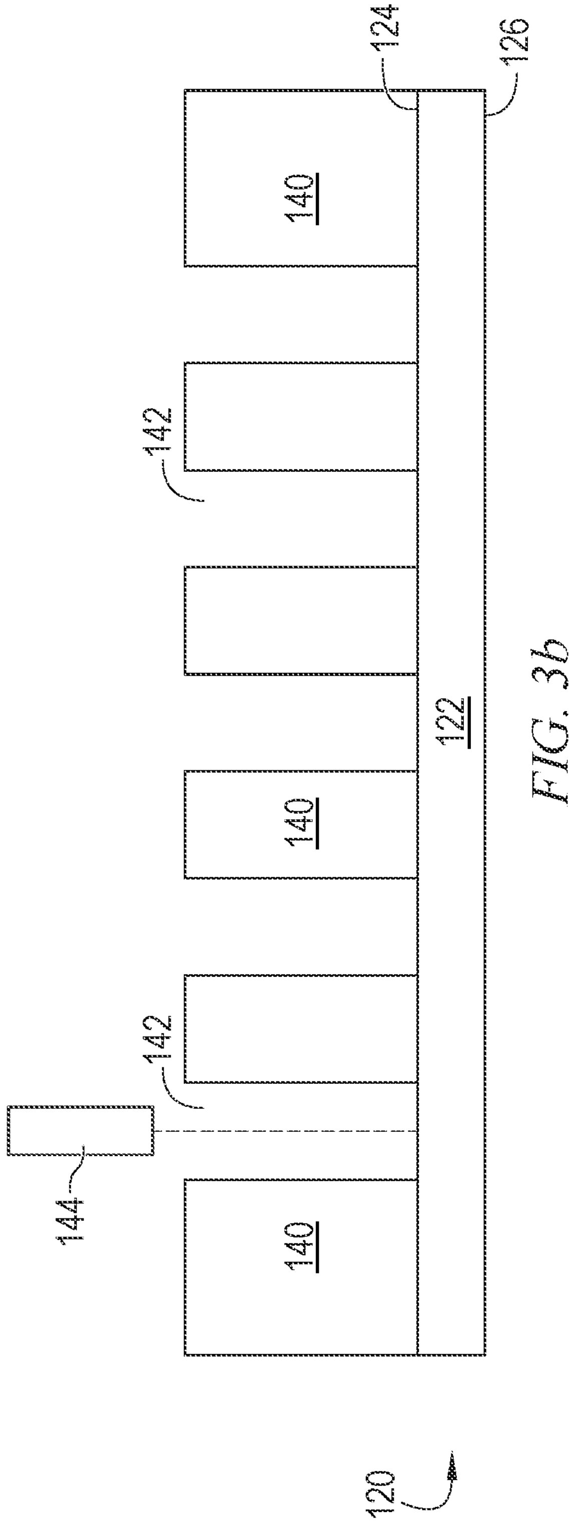

In another embodiment, and continuing from FIG. 2*a*, photoresist layer 140 is formed over surface 124 of substrate 120, as shown in FIG. 3*a*. In FIG. 3*b*, photoresist layer 140 is patterned and etched to form openings 142. Alternatively, openings 142 can be formed by laser direct ablation (LDA) using laser 144.

Figure 3C:
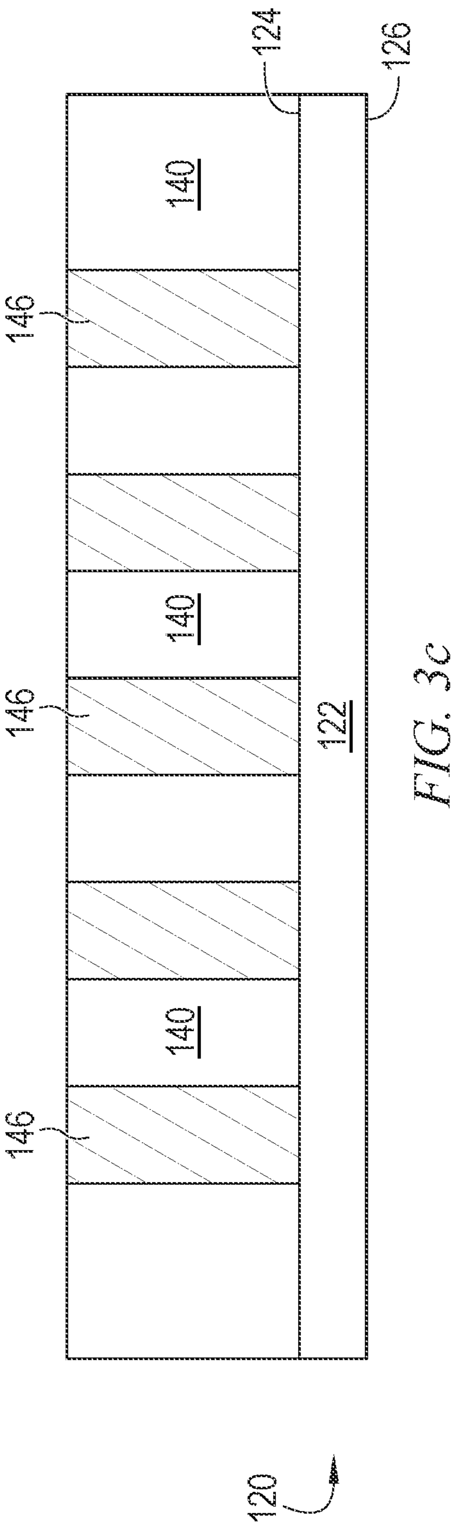

In FIG. 3*c*, electrically conductive material 146 is deposited into openings 142 by PVD, CVD, electrolytic plating, electroless plating process, or other suitable metal deposition process. Conductive material 146 can be one or more layers of Al, Cu, Sn, Ni, Au, Ag, or other suitable electrically conductive material.

Figure 3D:
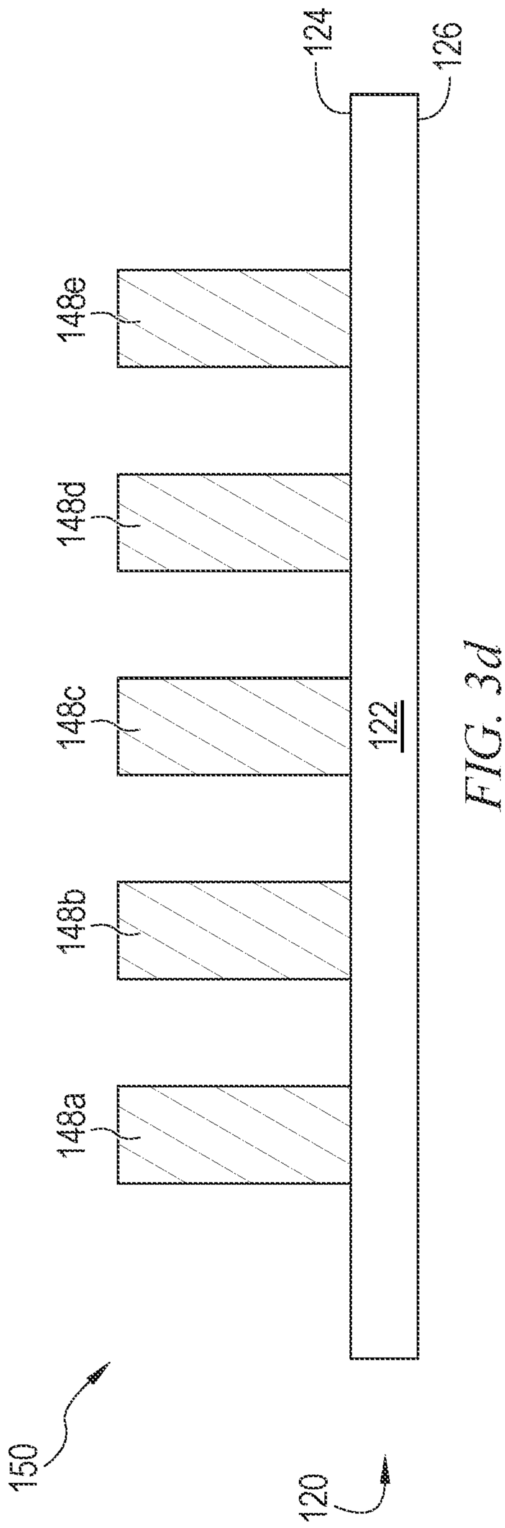

In FIG. 3*d*, photoresist layer 140 is removed leaving conductive posts or columns or pillars 148*a*, 148*b*, 148*c*, 148*d*, and 148*e* formed over surface 124 of substrate 120, as in vertical interconnect structure 150, similar to vertical interconnect structure 136.

Returning to FIG. 2*d*, an encapsulant or molding compound 152 is deposited over and around conductive posts 130*a*-130*e* and surface 124 of substrate 120 in vertical interconnect structure 136 using a paste printing, compressive molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. Encapsulant 152 is non-conductive, provides structural support, and environmentally protects the semiconductor device from external elements and contaminants. Although the subsequent process steps are described in terms of vertical interconnect structure 136, a similar encapsulation would apply to vertical interconnect structure 150 if that embodiment is utilized.

Figure 2D:
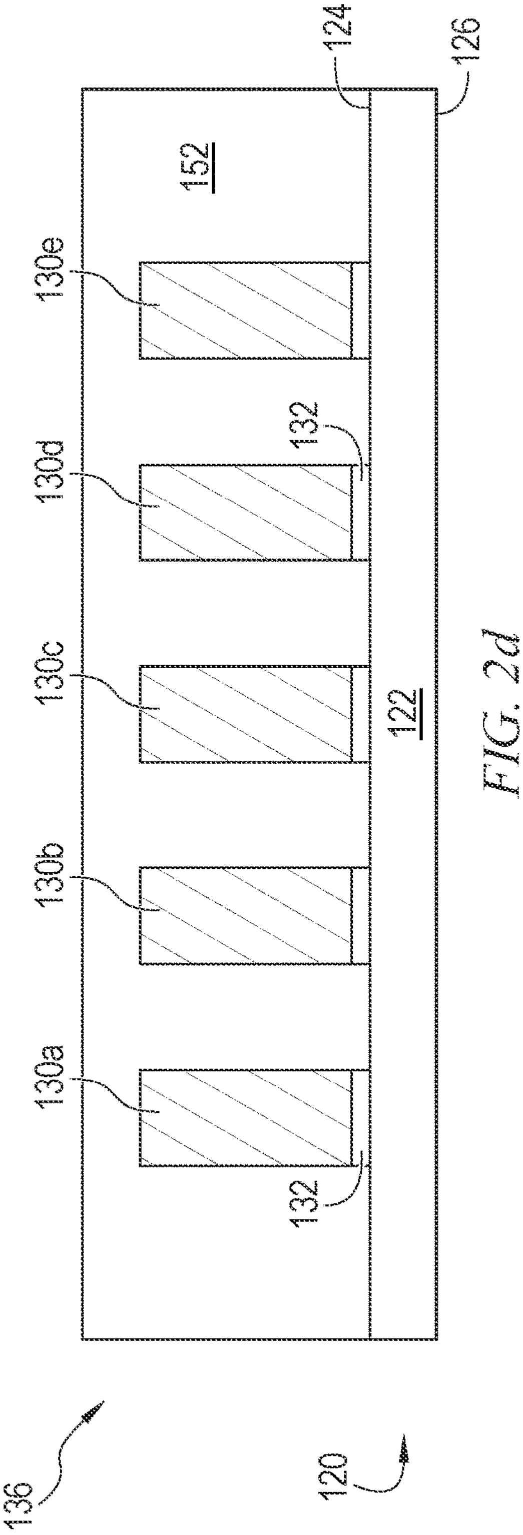
Figure 2E:
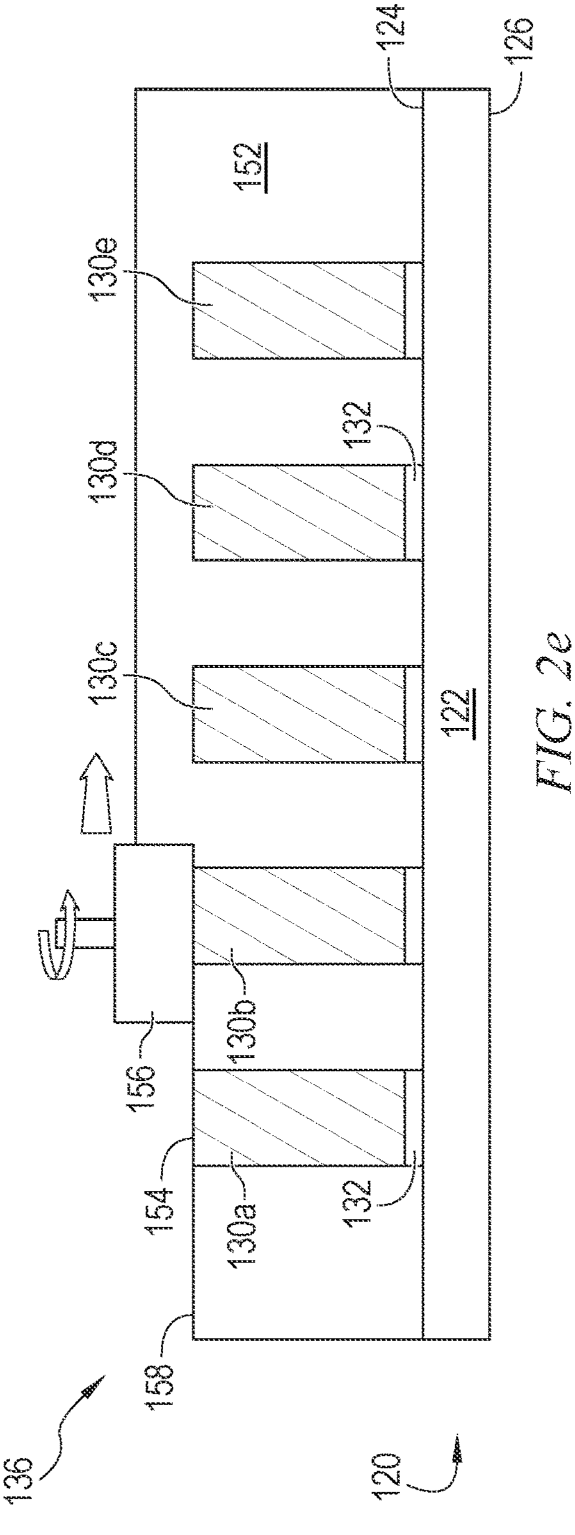
Figure 2F:
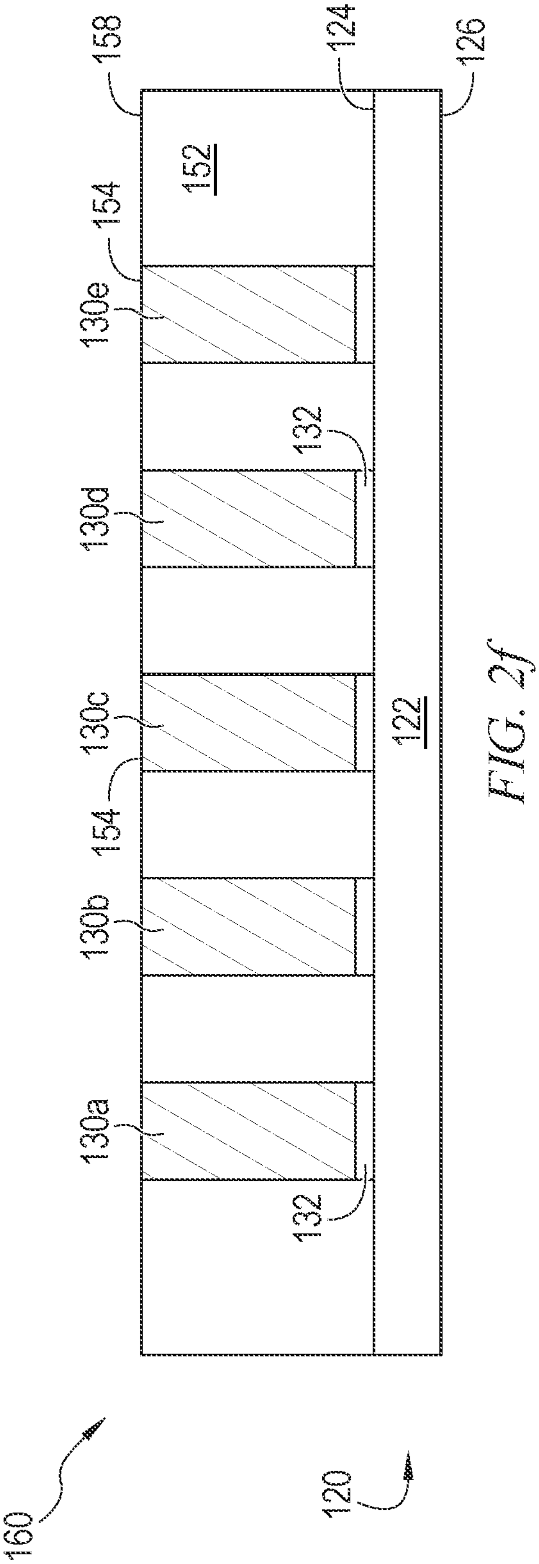

In FIG. 2*e*, a portion of encapsulant 152 is removed by grinder 156 to planarize surface 158 of encapsulant 152 and expose surface 154 of conductive pillars 130*a*-130*e*. FIG. 2*f* shows encapsulated vertical interconnect structure 160 post grinding with planarized surface 158 and exposed surface 154 of conductive posts 130*a*-130*e*.

Figure 2G:
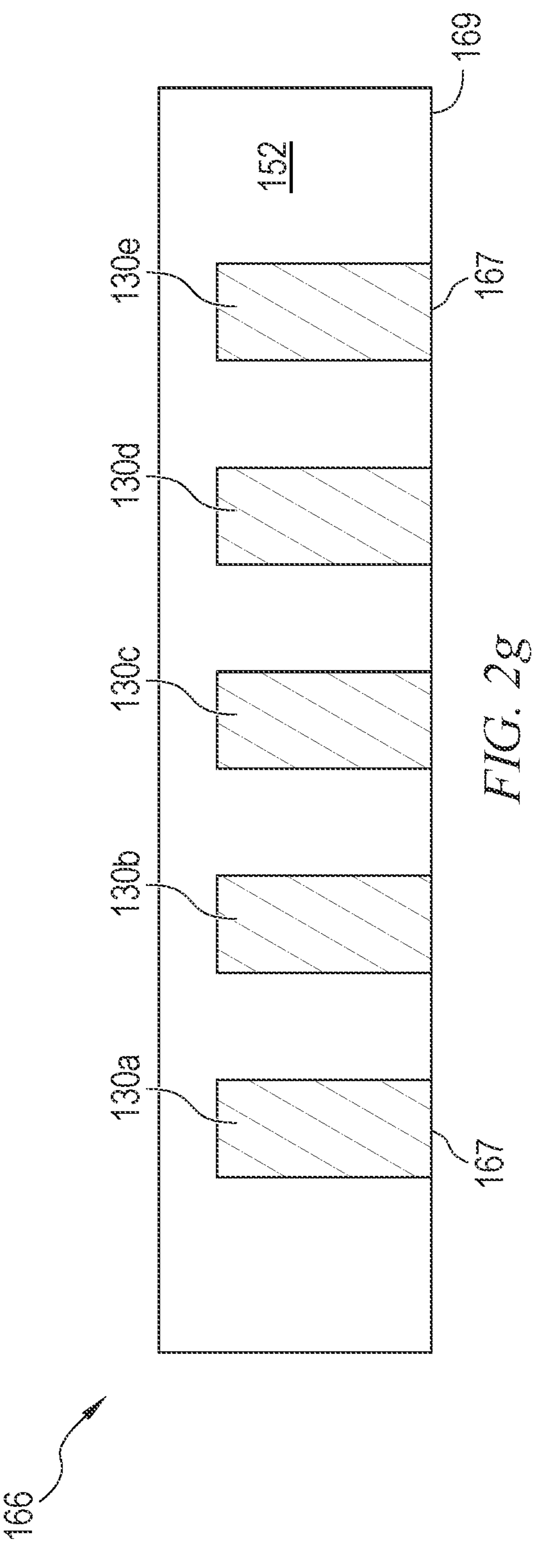

In another embodiment, continuing from FIG. 2*d*, substrate 120 is removed by chemical mechanical polishing (CMP), mechanical peel-off, mechanical grinding, thermal bake, UV light, or wet stripping, leaving encapsulated vertical interconnect structure 166 with encapsulant 152 covering conductive posts 130*a*-130*e*, while planarizing surface 169 of encapsulant 152 and exposing surface 167 of the conductive posts, as shown in FIG. 2*g*.

Figure 4A:
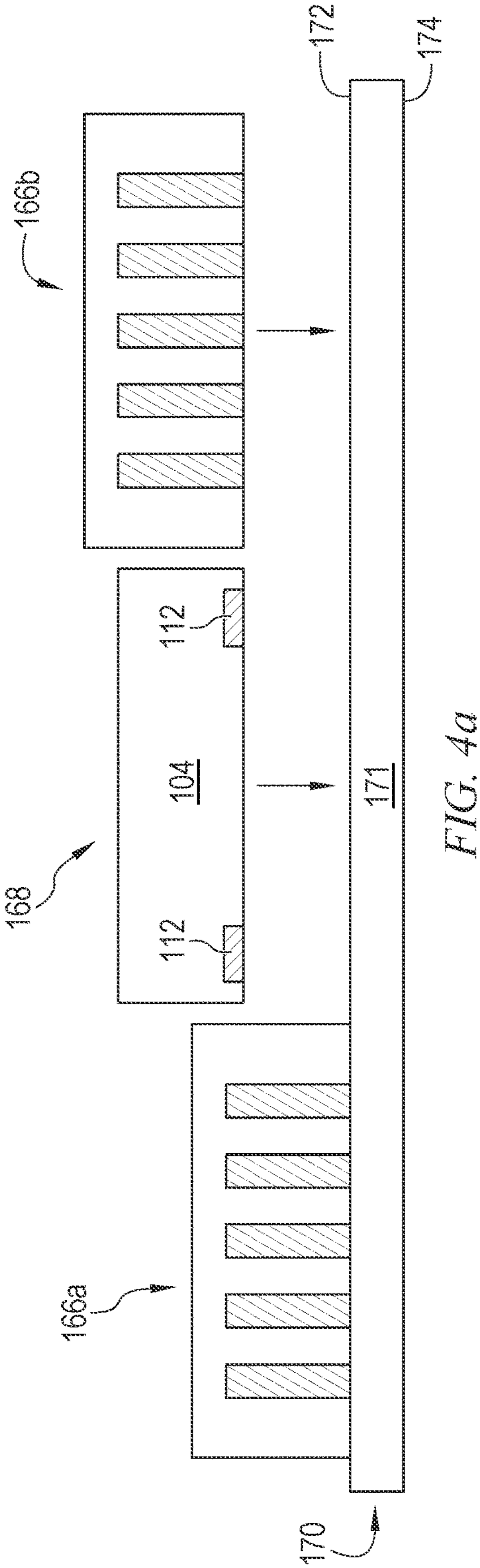
FIGS. 4*a*-4*h* illustrate packaging the encapsulated vertical interconnect structure from FIG. 2*g* with an electrical component.

FIG. 4*a* shows a temporary substrate 170 made with base material 171 as a multi-layer flexible laminate, ceramic, CCL, glass, or epoxy molding compound. Base material 171 can contain one or more layers of SiO2, Si3N4, SiON, Ta2O5, Al2O3, solder resist, polyimide, BCB, PBO, and other material having similar insulating and structural properties. Substrate 170 may include one or more laminated layers of PTFE prepreg, FR-4, FR-1, CEM-1, or CEM-3 with a combination of phenolic cotton paper, epoxy, resin, woven glass, matte glass, polyester, and other reinforcement fibers or fabrics. In another embodiment, substrate 120 can also be any suitable laminate interposer, PCB, wafer-form, strip interposer, leadframe, or other type of substrate. Substrate 170 has a thickness T and includes first major surface 172 and second major surface 174 opposite surface 172.

Encapsulated vertical interconnect structures 166*a* and 166*b* from FIG. 2*g* and electrical component 168 are disposed over surface 172 of substrate 170. For example, electrical component 168 can be similar to, or made similar to, semiconductor die 104 from FIG. 1*c* with conductive layer 112 oriented toward surface 172. Electrical component 168 can be other semiconductor die, semiconductor packages, surface mount devices, RF components, discrete electrical devices, or integrated passive devices (IPD).

Figure 4B:
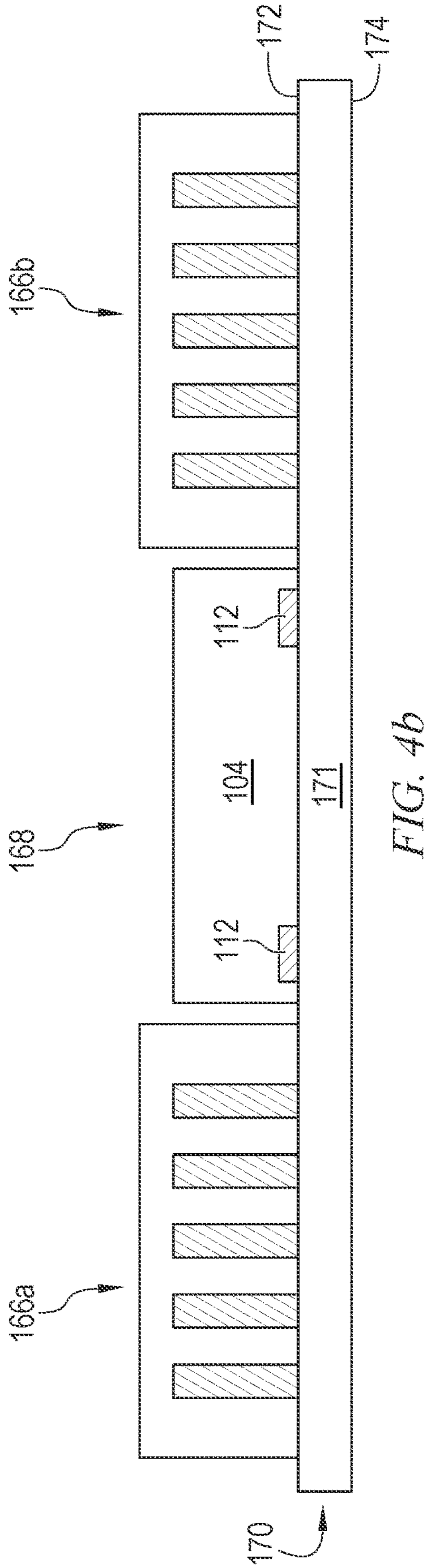

Encapsulated vertical interconnect structures 166*a*-166*b* and electrical component 168 are positioned over substrate 170 using a pick and place operation. Electrical component 168 is disposed between encapsulated vertical interconnect structures 166*a*-166*b*, or adjacent to either encapsulated vertical interconnect structure 166*a* or 166*b*. Encapsulated vertical interconnect structures 166*a*-166*b* and electrical component 168 can be bonded to surface 172 with a bonding layer (not shown). FIG. 4*b* shows encapsulated vertical interconnect structures 166*a*-166*b* and electrical component 168 bonded to substrate 170.

Figure 4C:
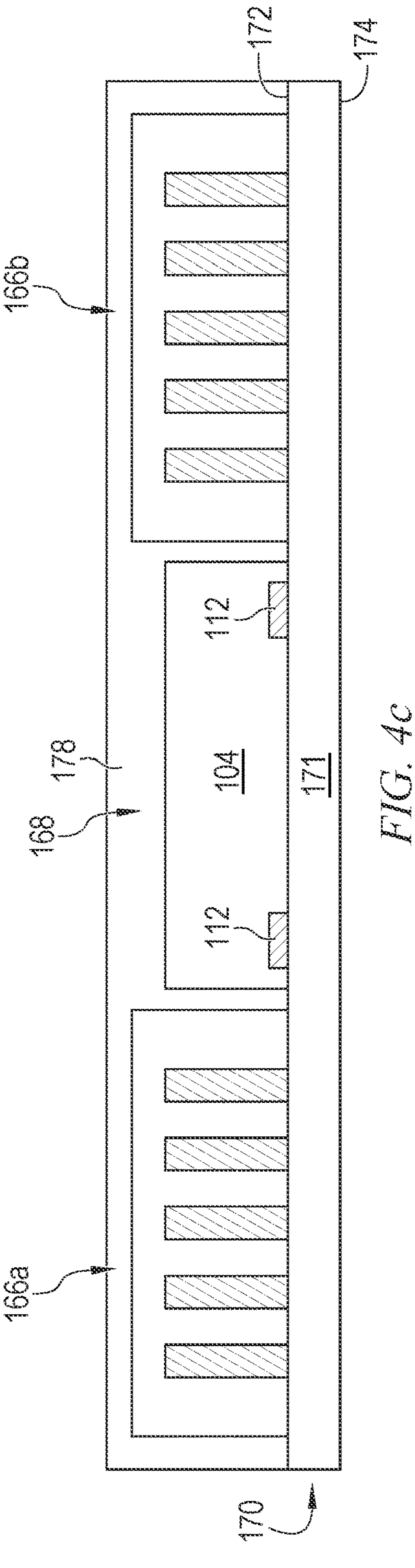

In FIG. 4*c*, an encapsulant or molding compound 178 is deposited over and around encapsulated vertical interconnect structures 166*a*-166*b* and electrical component 168 and surface 172 of substrate 170 using a paste printing, compressive molding, transfer molding, liquid encapsulant molding, vacuum lamination, spin coating, or other suitable applicator. Encapsulant 178 can be polymer composite material, such as epoxy resin with filler, epoxy acrylate with filler, or polymer with proper filler. Encapsulant 178 is non-conductive, provides structural support, and environmentally protects the semiconductor device from external elements and contaminants.

Figure 4D:
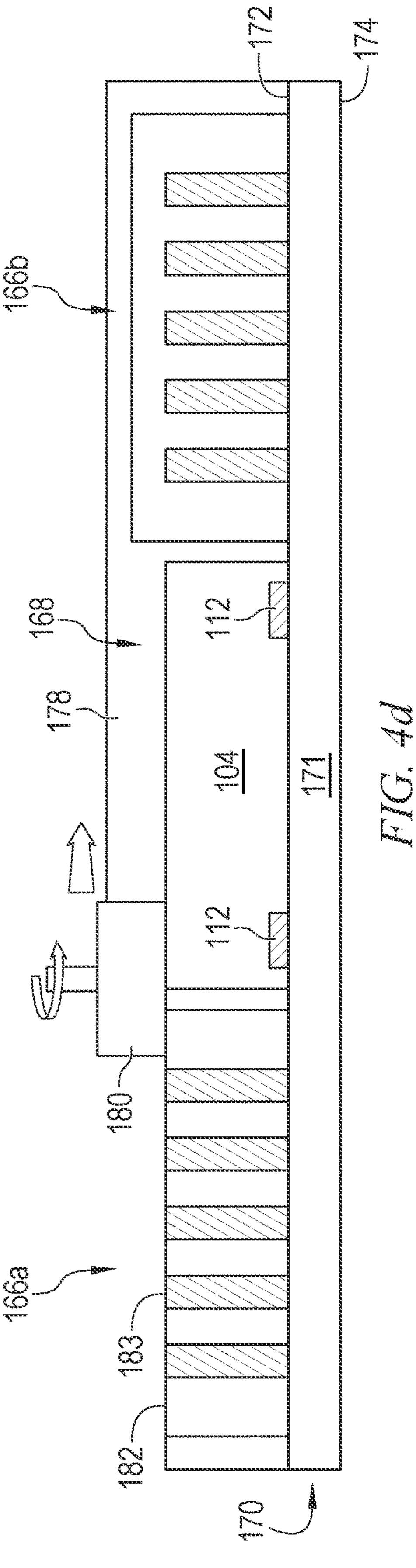

In FIG. 4*d*, a portion of encapsulant 178 is removed by grinder 180 to planarize surface 182 of encapsulant 178 and expose surface 183 of conductive pillars 130*a*-130*e*. FIG. 2*e* shows the encapsulated vertical interconnect structure post grinding with planarized surface 182 and exposed surface 194 of conductive posts 130*a*-130*e*. Surface 182 is planar with a surface of encapsulant 178. Encapsulant 178 may or may not cover back surface 108 of electrical component 168. FIG. 4*f* is a top view of encapsulated vertical interconnect structures 166*a*-166*b* and electrical component 168 bonded to substrate 170.

Figure 4E:
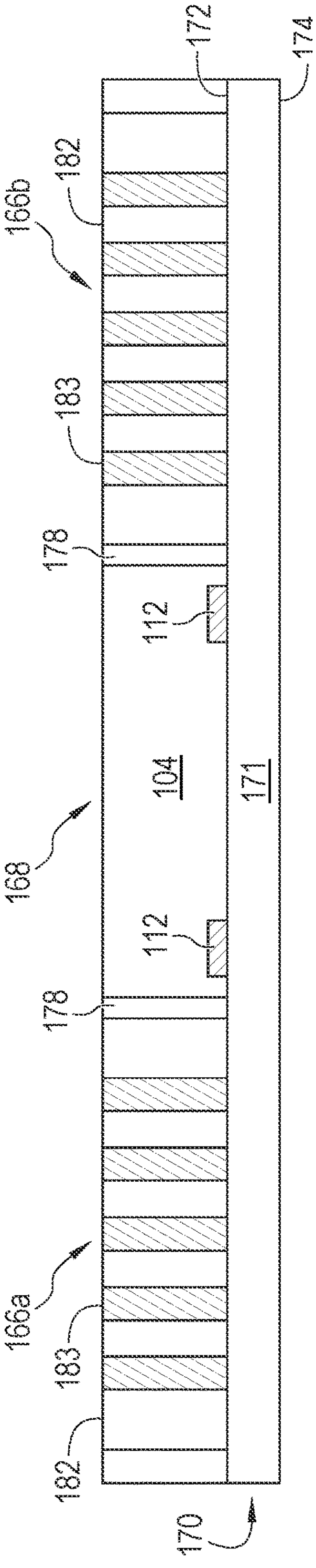
Figure 4F:
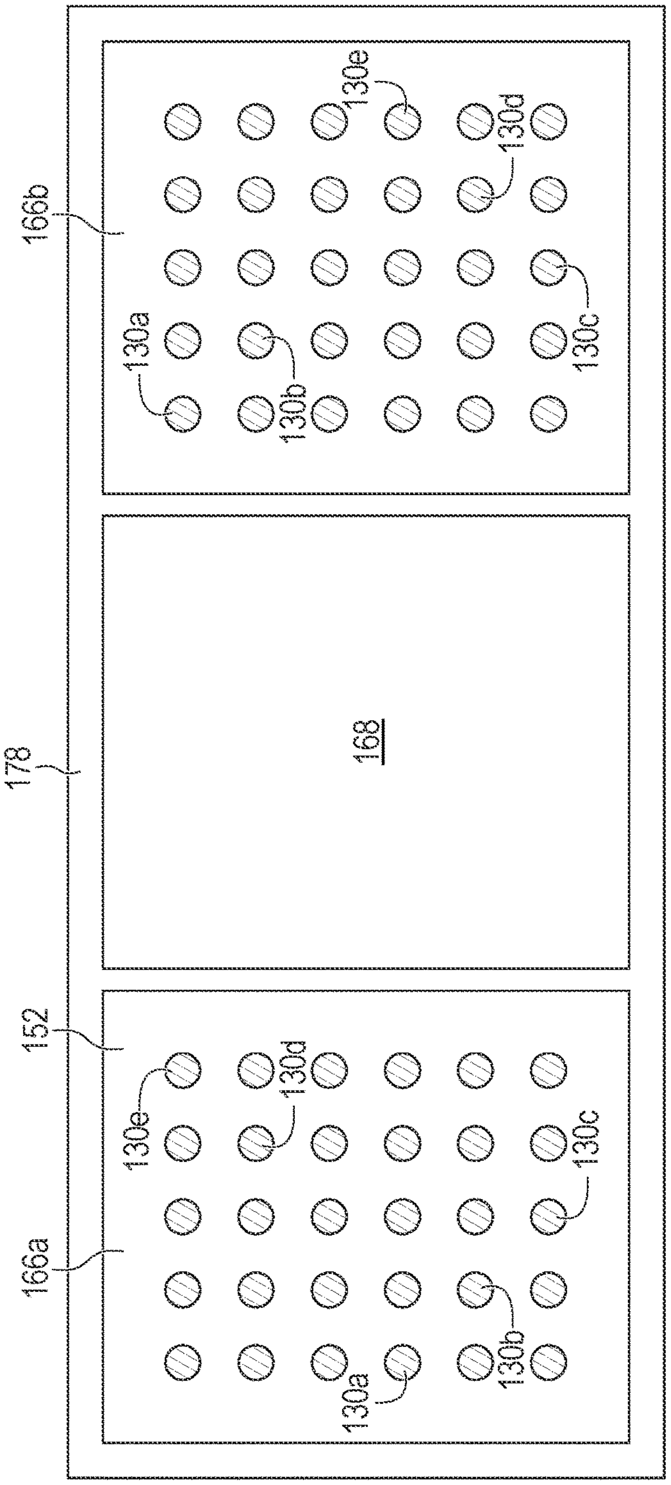
Figure 4G:
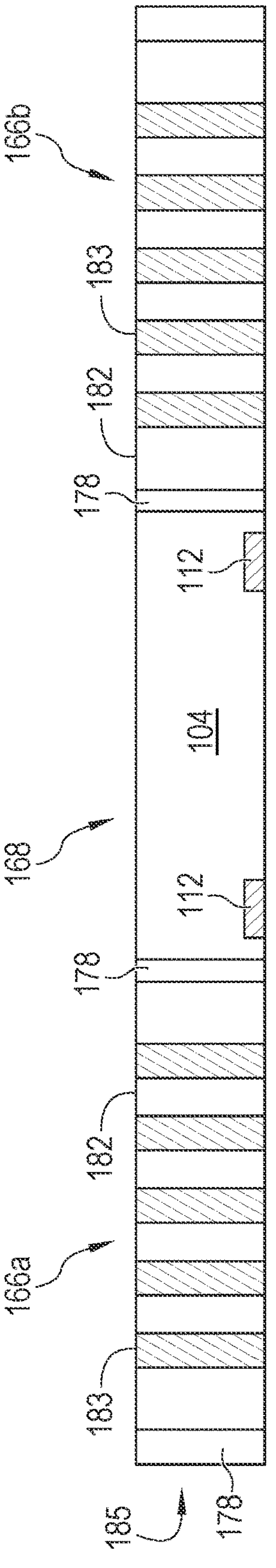

In FIG. 4*g*, substrate 170 is removed by CMP, mechanical peel-off, mechanical grinding, thermal bake, UV light, or wet stripping, leaving semiconductor package 185.

Figure 4H:
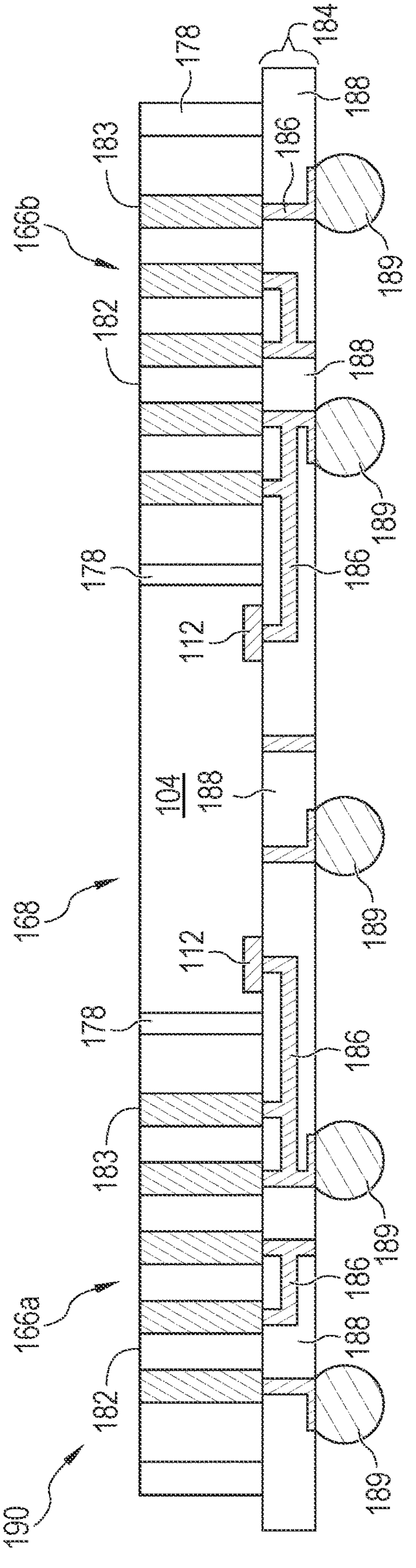

As an optional feature, a build-up interconnect structure 184 is formed over semiconductor package 185, as in FIG. 4*h*. Conductive layers 186 and insulating layers 188 are formed within interconnect substrate 184. Conductive layers 186 can be one or more layers of Al, Cu, Sn, Ni, Au, Ag, or other suitable electrically conductive material. Conductive layers 186 can be formed using PVD, CVD, electrolytic plating, electroless plating process, or other suitable metal deposition process. Conductive layer 186 provides horizontal electrical interconnect across substrate 184 and vertical electrical interconnect through the substrate. Portions of conductive layers 186 can be electrically common or electrically isolated depending on the design and function of electrical component 168. Insulating layers 188 contain one or more layers of SiO2, Si3N4, SiON, Ta2O5, Al2O3, solder resist, polyimide, BCB, PBO, and other material having similar insulating and structural properties. Insulating layers 188 can be formed using PVD, CVD, printing, lamination, spin coating, spray coating, sintering or thermal oxidation. Insulating layers 188 provide isolation between conductive layers 186. There can be multiple conductive layers like 186 separated by multiple insulating layers like 188.

An electrically conductive bump material is deposited over conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form balls or bumps 189. In one embodiment, bump 189 is formed over an under bump metallization (UBM) having a wetting layer, barrier layer, and adhesive layer. Bump 189 can also be compression bonded or thermocompression bonded to conductive layer 186. Bump 189 represents one type of interconnect structure that can be formed over conductive layer 186. The interconnect structure can also use bond wires, conductive paste, stud bump, micro bump, or other electrical interconnect.

Semiconductor package 185 or 190 represents an encapsulated vertical interconnect structure applicable to wafer level processing (WLP). Conductive posts 130 or 148 provide high post height to diameter ratio. Encapsulated vertical interconnect structures 160 and 166 are pre-formed over substrate 120 prior to mounting to substrate 170. Encapsulated vertical structures 160 and 166 are lamination free so there is little or no risk of delamination. Conductive posts 130 can also be glass or plastic fiber to transmit light in optical applications.

Figure 5A:
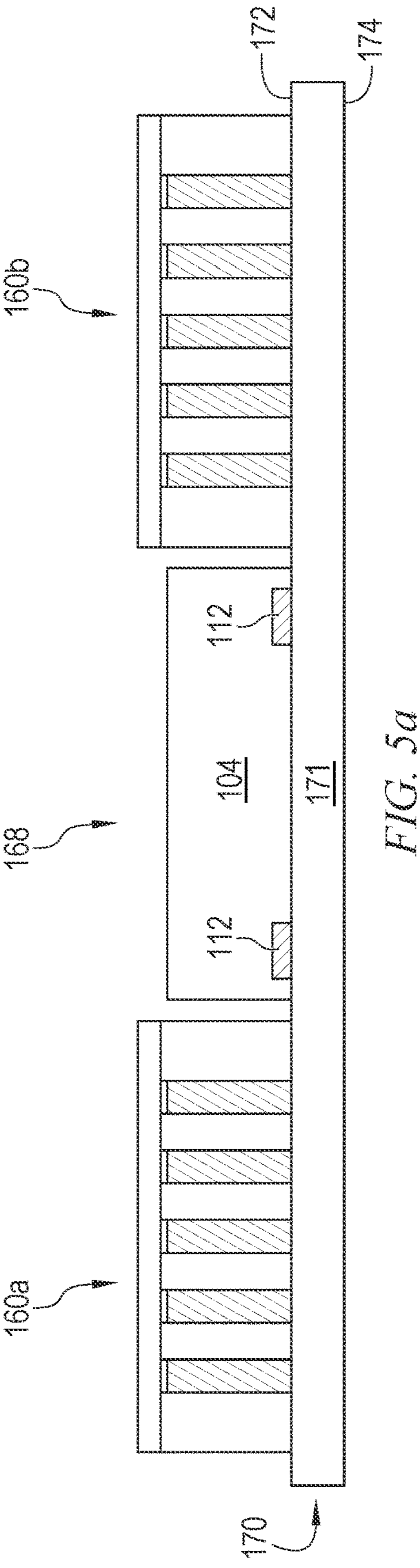
FIGS. 5*a*-5*e* illustrate packaging the encapsulated vertical interconnect structure from FIG. 2*f* with an electrical component.

In another embodiment, FIG. 5*a* shows encapsulated vertical interconnect structures 160*a* and 160*b* from FIG. 2*f* and electrical component 168 disposed over surface 172 of substrate 170. Components having a similar function are assigned the same reference number. Encapsulated vertical interconnect structures 160*a*-160*b* and electrical component 168 are positioned over substrate 170 using a pick and place operation, similar to FIG. 4*a*-4*b*. In this case, temporary substrate 120 of encapsulated vertical interconnect structures 160*a*-160*b* is oriented away from surface 172. Electrical component 168 is disposed between encapsulated vertical interconnect structures 160*a*-160*b*, or adjacent to either encapsulated vertical interconnect structure 160*a* or 160*b*. Encapsulated vertical interconnect structures 160*a*-160*b* and electrical component 168 can be bonded to surface 172 with a bonding layer.

Figure 5B:
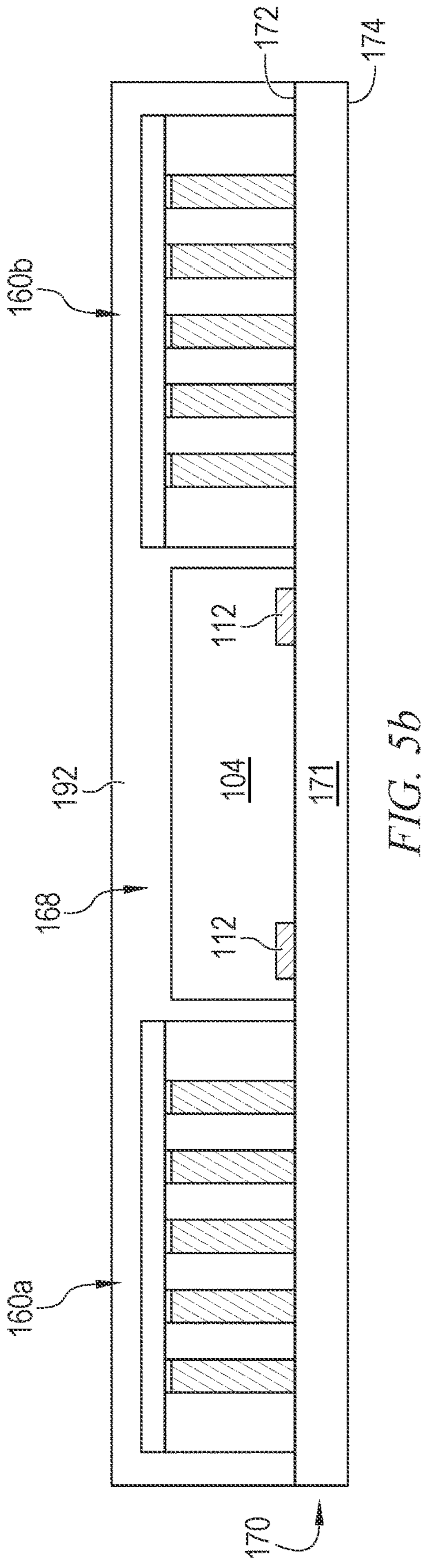

In FIG. 5*b*, an encapsulant or molding compound 192 is deposited over and around encapsulated vertical interconnect structures 160*a*-160*b* and electrical component 168 and surface 172 of substrate 170 using a paste printing, compressive molding, transfer molding, liquid encapsulant molding, vacuum lamination, spin coating, or other suitable applicator. Encapsulant 192 can be polymer composite material, such as epoxy resin with filler, epoxy acrylate with filler, or polymer with proper filler. Encapsulant 192 is non-conductive, provides structural support, and environmentally protects the semiconductor device from external elements and contaminants.

Figures 5C, 5D, 5E:
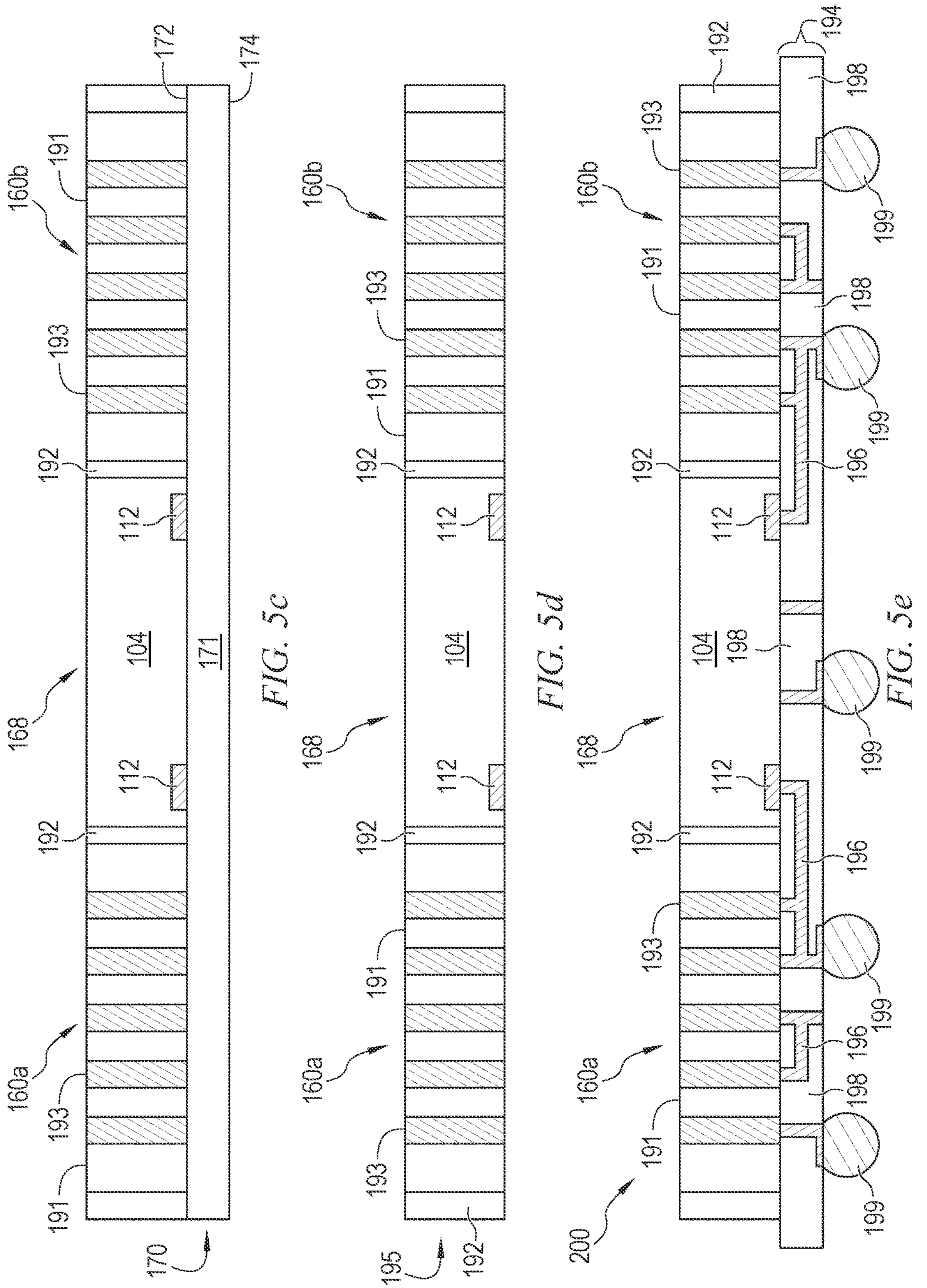

In FIG. 5*c*, a portion of encapsulant 178 and the entirety of substrate 120 are removed by a grinder, similar to FIG. 4*e*, to planarize surface 191 of encapsulant 192 and expose surface 193 of conductive pillars 130*a*-130*e*. Surface 191 is planar with a surface of encapsulant 192. A top view of encapsulated vertical interconnect structures 160*a*-160*b* and electrical component 168 bonded to substrate 170 would be similar to FIG. 4*f*.

In FIG. 5*d*, substrate 170 is removed by CMP, mechanical peel-off, mechanical grinding, thermal bake, UV light, or wet stripping, leaving semiconductor package 195.

As an optional feature, a build-up interconnect structure 194 is formed over semiconductor package 195, as in FIG. 5*e*. Conductive layers 196 and insulating layers 198 are formed within interconnect substrate 194. Conductive layers 196 can be one or more layers of Al, Cu, Sn, Ni, Au, Ag, or other suitable electrically conductive material. Conductive layers 196 can be formed using PVD, CVD, electrolytic plating, electroless plating process, or other suitable metal deposition process. Conductive layer 196 provides horizontal electrical interconnect across substrate 194 and vertical electrical interconnect through the substrate. Portions of conductive layers 196 can be electrically common or electrically isolated depending on the design and function of electrical component 168. Insulating layers 198 contain one or more layers of SiO2, Si3N4, SiON, Ta2O5, Al2O3, solder resist, polyimide, BCB, PBO, and other material having similar insulating and structural properties. Insulating layers 198 can be formed using PVD, CVD, printing, lamination, spin coating, spray coating, sintering or thermal oxidation. Insulating layers 198 provide isolation between conductive layers 186. There can be multiple conductive layers like 196 separated by multiple insulating layers like 198.

An electrically conductive bump material is deposited over conductive layer 196 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 196 using a suitable attachment or bonding process. In one embodiment, the bump material is reflowed by heating the material above its melting point to form balls or bumps 199. In one embodiment, bump 199 is formed over a UBM having a wetting layer, barrier layer, and adhesive layer. Bump 199 can also be compression bonded or thermocompression bonded to conductive layer 196. Bump 199 represents one type of interconnect structure that can be formed over conductive layer 196. The interconnect structure can also use bond wires, conductive paste, stud bump, micro bump, or other electrical interconnect.

Semiconductor package 200 represents an encapsulated vertical interconnect structure applicable to WLP. Conductive posts 130 or 148 provide high post height to diameter ratio. Encapsulated vertical interconnect structures 160 and 166 are pre-formed over substrate 120 prior to mounting to substrate 170. Encapsulated vertical structures 160 and 166 are lamination free so there is little or no risk of delamination. Conductive posts 130 can also be glass or plastic fiber to transmit light in optical applications.

Figure 6A:
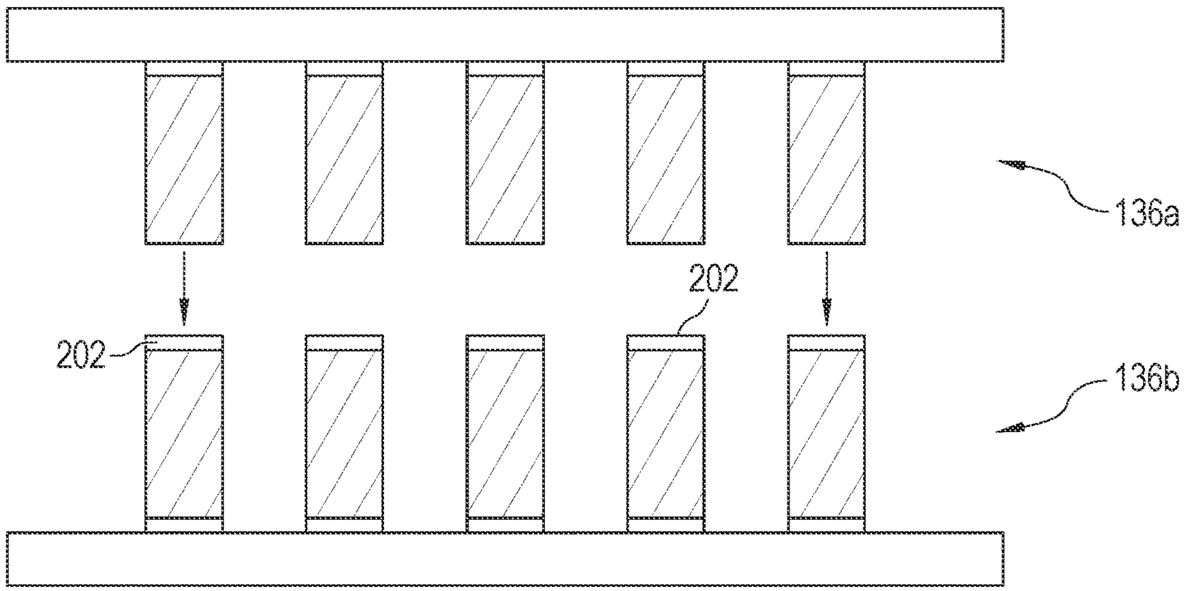
FIGS. 6*a*-6*e* illustrate a process of forming an encapsulated stacked vertical interconnect structure.
Figure 6B:
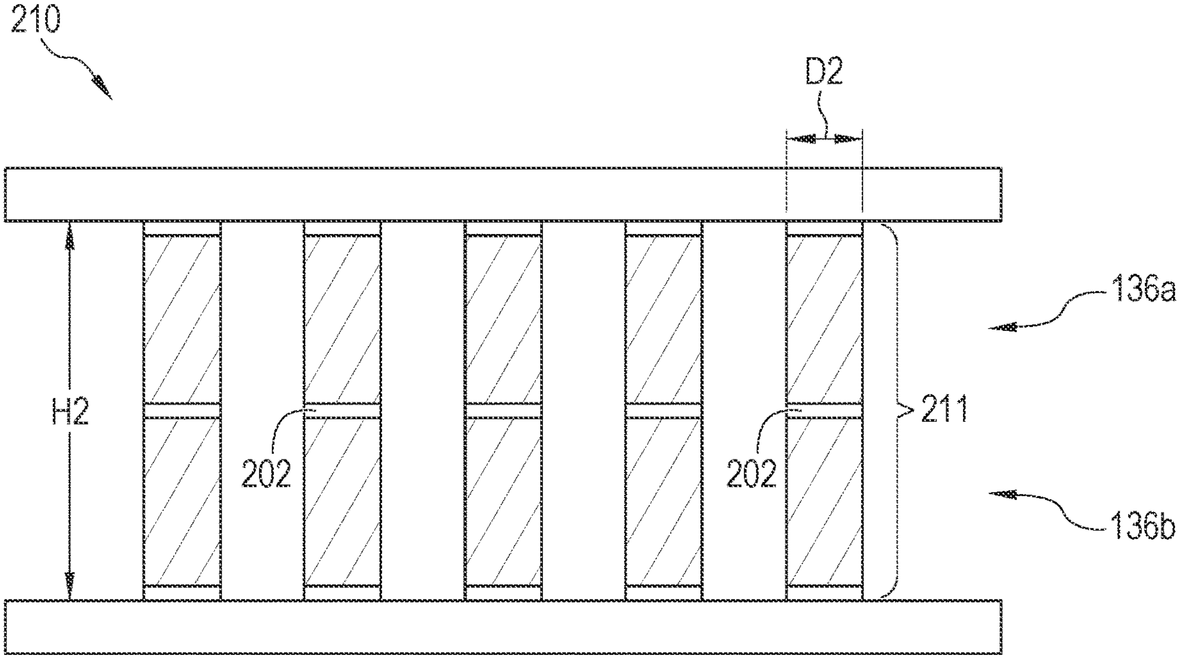

In another embodiment, the conductive posts like 130*a*-130*e* can be stacked. FIG. 6*a* shows vertical interconnect structure 136 from FIG. 2*c*, although vertical interconnect structure 150 from FIG. 3*d* can be used. Vertical interconnect structure 136*a* is disposed over vertical interconnect structure 136*b* using a pick and place operation. Conductive posts 130*a*-130*e* in vertical interconnect structure 136*a* are brought into contact with conductive posts 130*a*-130*e* in vertical interconnect structure 136*b* and bonded with conductive paste or solder 202, as vertical interconnect structure 210 in FIG. 6*b*. In one embodiment, the stacked conductive posts 211 have a height H2 of 2*H1 and diameter D2 of about the same or larger than D1 to increase the height to diameter aspect ratio suitable for embedded semiconductor die 104 or Si photonic component required a thickness more or equal to 100 μm.

Figure 6C:
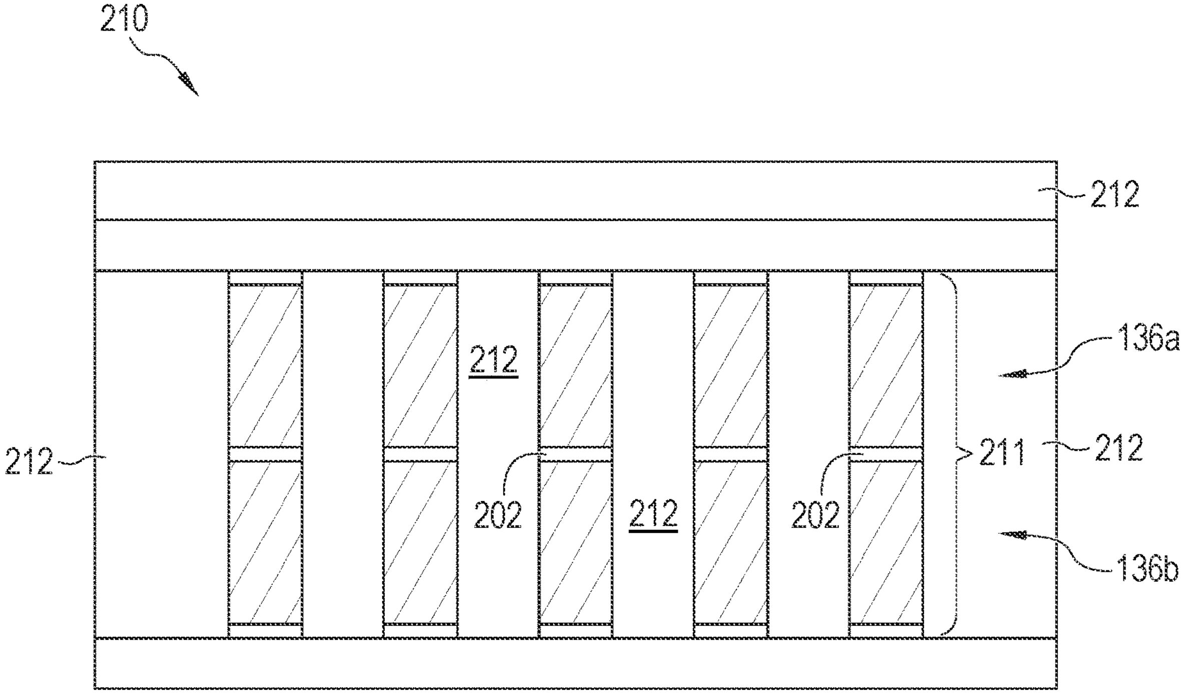

In FIG. 6*c*, an encapsulant or molding compound 212 is deposited over and around vertical interconnect structure 210 using a paste printing, compressive molding, transfer molding, liquid encapsulant molding, vacuum lamination, spin coating, or other suitable applicator. Encapsulant 212 can be polymer composite material, such as epoxy resin with filler, epoxy acrylate with filler, or polymer with proper filler. Encapsulant 212 is non-conductive, provides structural support, and environmentally protects the semiconductor device from external elements and contaminants.

Figure 6D:
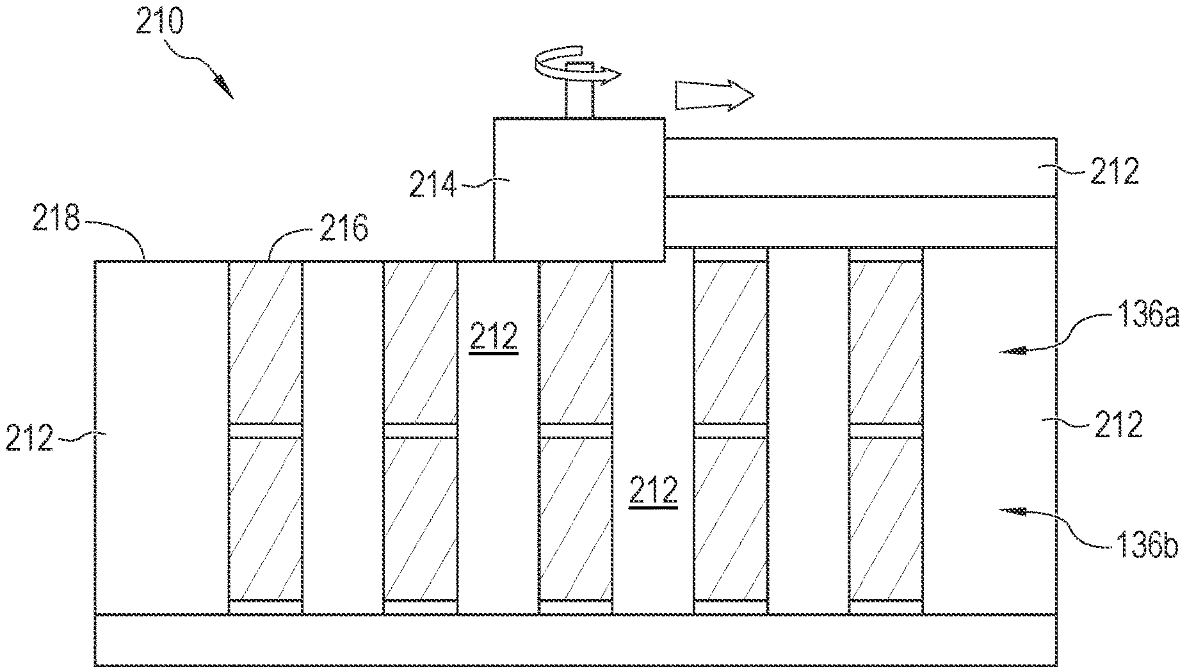
Figure 6E:
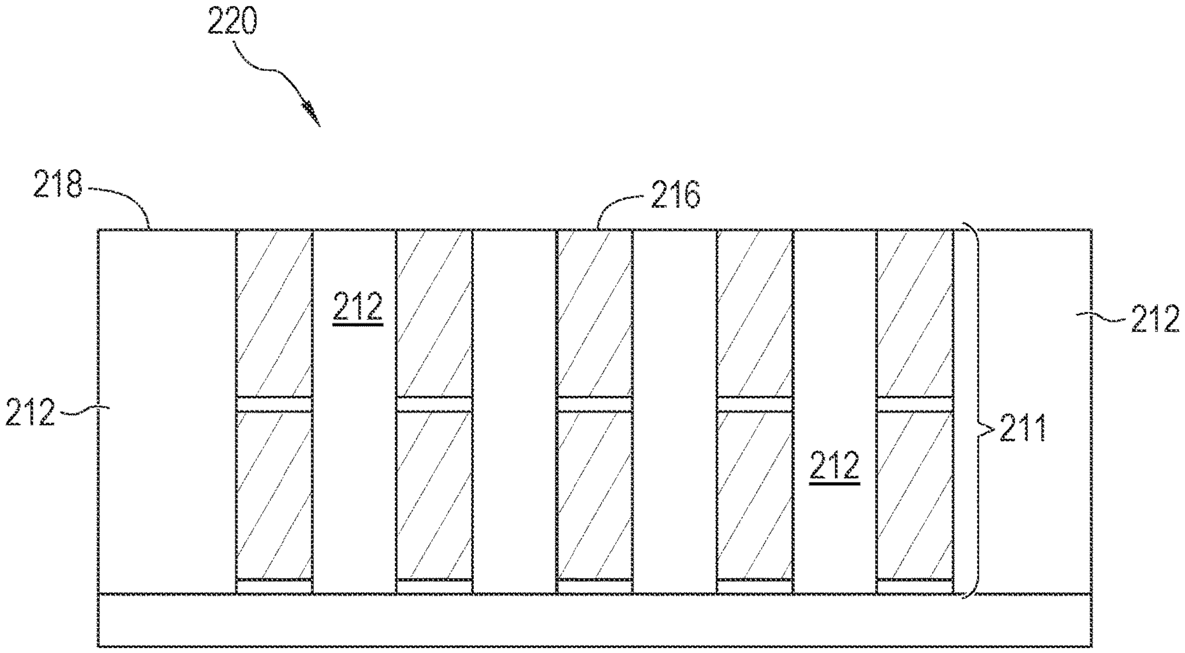

In FIG. 6*d*, a portion of encapsulant 212 and the entirety of substrate 120 in vertical interconnect structure 136*a* are removed by grinder 214, similar to FIG. 4*e*, to planarize surface 218 of encapsulant 192 and expose surface 216 of conductive pillars 130*a*-130*e* in vertical interconnect structure 136*a*. FIG. 6*e* shows encapsulated vertical interconnect structure 220 post grinding with planarized surface 218 and exposed conductive posts 130*a*-130*e*.

Figure 7A:
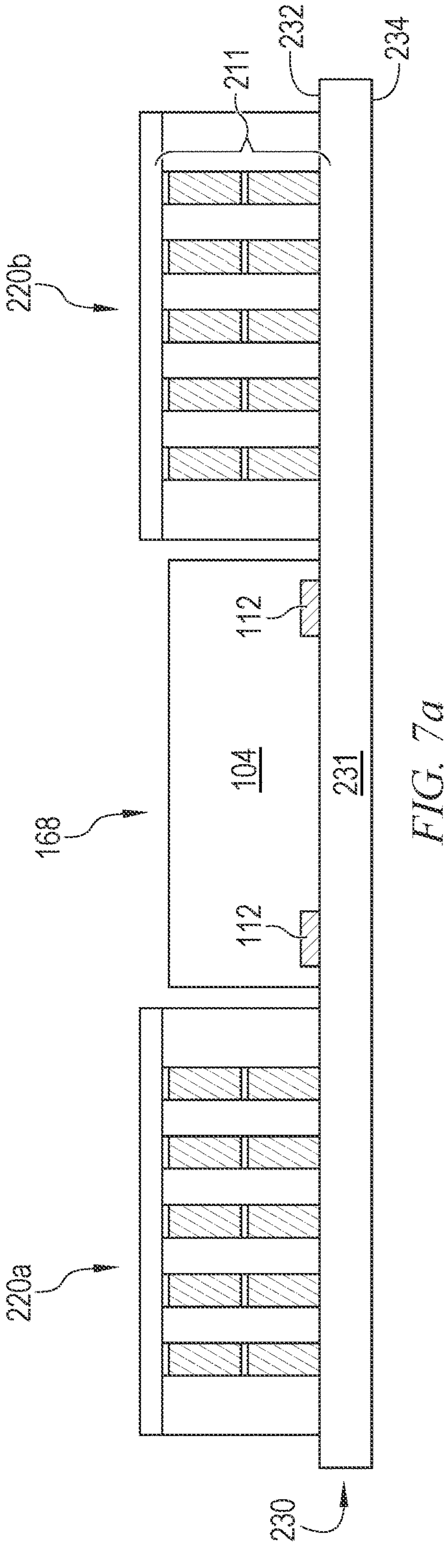
FIGS. 7*a*-7*e* illustrate packaging the encapsulated stacked vertical interconnect structure from FIG. 6*d* with an electrical component.

FIG. 7*a* shows a temporary substrate 230 made with base material 231 as a multi-layer flexible laminate, ceramic, CCL, glass, or epoxy molding compound. Base material 231 can contain one or more layers of SiO2, Si3N4, SiON, Ta2O5, Al2O3, solder resist, polyimide, BCB, PBO, and other material having similar insulating and structural properties. Substrate 230 may include one or more laminated layers of PTFE prepreg, FR-4, FR-1, CEM-1, or CEM-3 with a combination of phenolic cotton paper, epoxy, resin, woven glass, matte glass, polyester, and other reinforcement fibers or fabrics. In another embodiment, substrate 230 can also be any suitable laminate interposer, PCB, wafer-form, strip interposer, leadframe, or other type of substrate. Substrate 230 has a thickness T and includes first major surface 232 and second major surface 234 opposite surface 232. Encapsulated vertical interconnect structures 220*a*-220*b* from FIG. 6*e* and electrical component 168 are positioned over substrate 230 using a pick and place operation, similar to FIG. 4*a*-4*b*. In this case, the remaining temporary substrate 120 of encapsulated vertical interconnect structures 220*a*-220*b* is oriented away from surface 232. Electrical component 168 is disposed between encapsulated vertical interconnect structures 220*a*-220*b*, or adjacent to either encapsulated vertical interconnect structure 220*a* or 220*b*. Encapsulated interconnect structures 220*a*-220*b* and electrical component 168 can be bonded to surface 232 with a bonding layer.

Figure 7B:
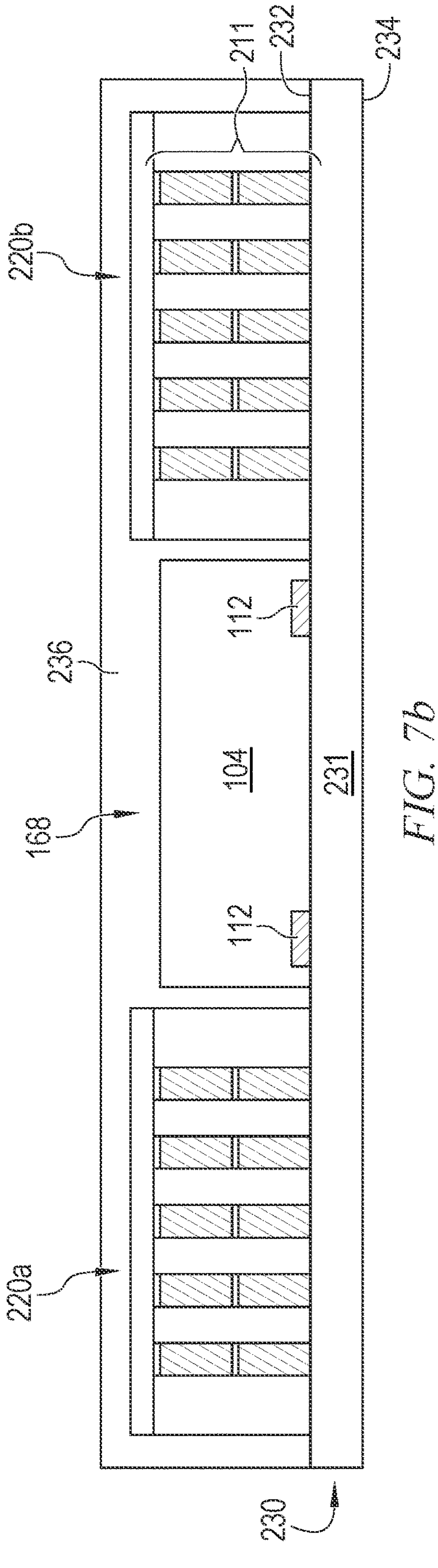

In FIG. 7*b*, an encapsulant or molding compound 236 is deposited over and around encapsulated vertical interconnect structures 220*a*-220*b* and electrical component 168 and surface 232 of substrate 230 using a paste printing, compressive molding, transfer molding, liquid encapsulant molding, vacuum lamination, spin coating, or other suitable applicator. Encapsulant 236 can be polymer composite material, such as epoxy resin with filler, epoxy acrylate with filler, or polymer with proper filler. Encapsulant 236 is non-conductive, provides structural support, and environmentally protects the semiconductor device from external elements and contaminants.

Figure 7C:
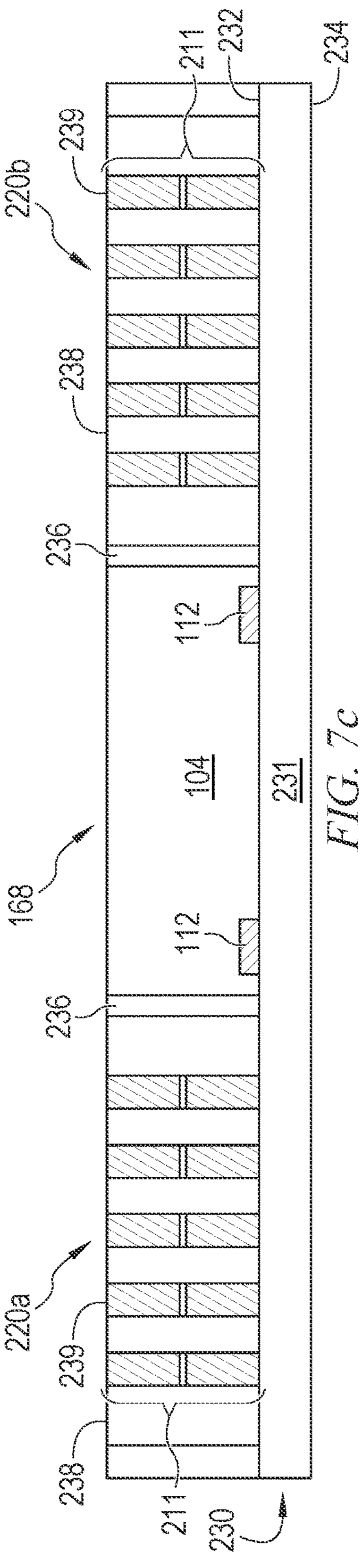

In FIG. 7*c*, a portion of encapsulant 236 and the entirety of substrate 120 of vertical interconnect structure 136*a* are removed by a grinder, similar to FIG. 4*e*, to planarize surface 238 of encapsulant 236 and expose surface 239 of conductive pillars 130*a*-130*e*. Surface 238 is planar with a surface of encapsulant 236. A top view of encapsulated vertical interconnect structures 220*a*-220*b* and electrical component 168 bonded to substrate 230 would be similar to FIG. 4*f*.

Figure 7D:
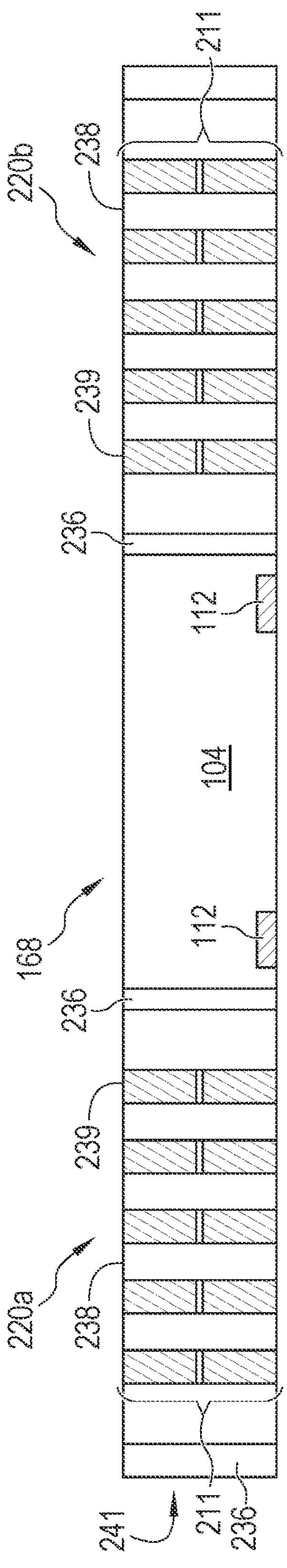

In FIG. 7*d*, substrate 230 is removed by CMP, mechanical peel-off, mechanical grinding, thermal bake, UV light, or wet stripping, leaving semiconductor package 241.

Figure 7E:
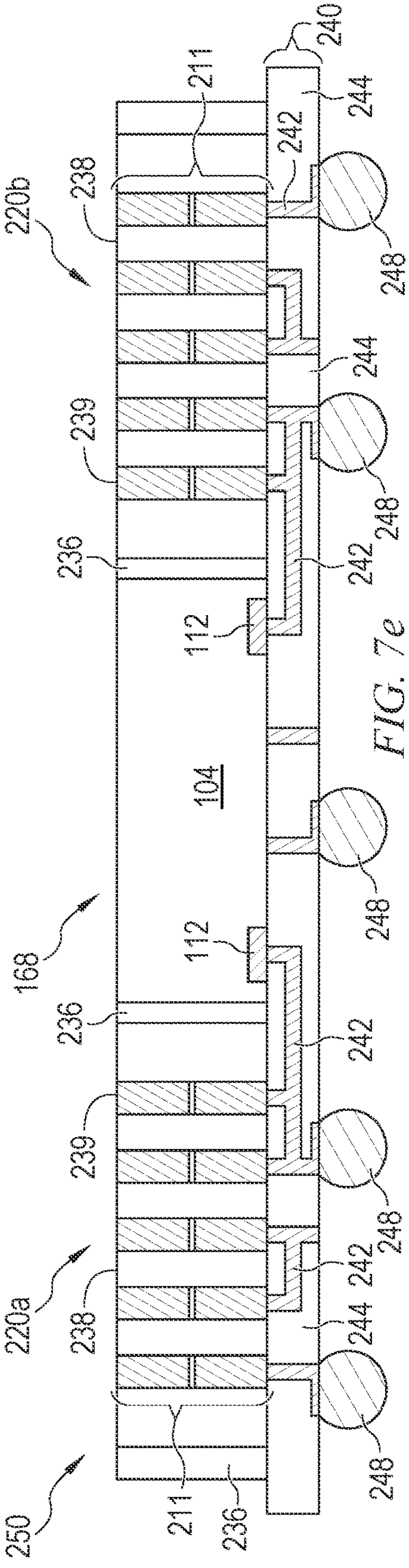

As an optional feature, a build-up interconnect structure 240 is formed over semiconductor package 241, as in FIG. 7*e*. Conductive layers 242 and insulating layers 244 are formed within interconnect substrate 240. Conductive layers 242 can be one or more layers of Al, Cu, Sn, Ni, Au, Ag, or other suitable electrically conductive material. Conductive layers 242 can be formed using PVD, CVD, electrolytic plating, electroless plating process, or other suitable metal deposition process. Conductive layer 242 provides horizontal electrical interconnect across substrate 240 and vertical electrical interconnect through the substrate. Portions of conductive layers 242 can be electrically common or electrically isolated depending on the design and function of electrical component 168. Insulating layers 244 contain one or more layers of SiO2, Si3N4, SiON, Ta2O5, Al2O3, solder resist, polyimide, BCB, PBO, and other material having similar insulating and structural properties. Insulating layers 244 can be formed using PVD, CVD, printing, lamination, spin coating, spray coating, sintering or thermal oxidation. Insulating layers 244 provide isolation between conductive layers 242. There can be multiple conductive layers like 242 separated by multiple insulating layers like 244.

An electrically conductive bump material is deposited over conductive layer 242 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 242 using a suitable attachment or bonding process. In one embodiment, the bump material is reflowed by heating the material above its melting point to form balls or bumps 248. In one embodiment, bump 248 is formed over a UBM having a wetting layer, barrier layer, and adhesive layer. Bump 248 can also be compression bonded or thermocompression bonded to conductive layer 242. Bump 248 represents one type of interconnect structure that can be formed over conductive layer 242. The interconnect structure can also use bond wires, conductive paste, stud bump, micro bump, or other electrical interconnect.

Semiconductor package 241 or 250 represents an encapsulated vertical interconnect structure applicable to WLP. Conductive posts 211 provide a higher post height to diameter ratio by nature of being stacked. Encapsulated vertical interconnect structures 160 and 166 are pre-formed over substrate 120 prior to mounting to substrate 170. Encapsulated vertical structures 160 and 166 are lamination free so there is little or no risk of delamination. Conductive posts 211 can also be glass or plastic fiber to transmit light in optical applications.

Figure 8:
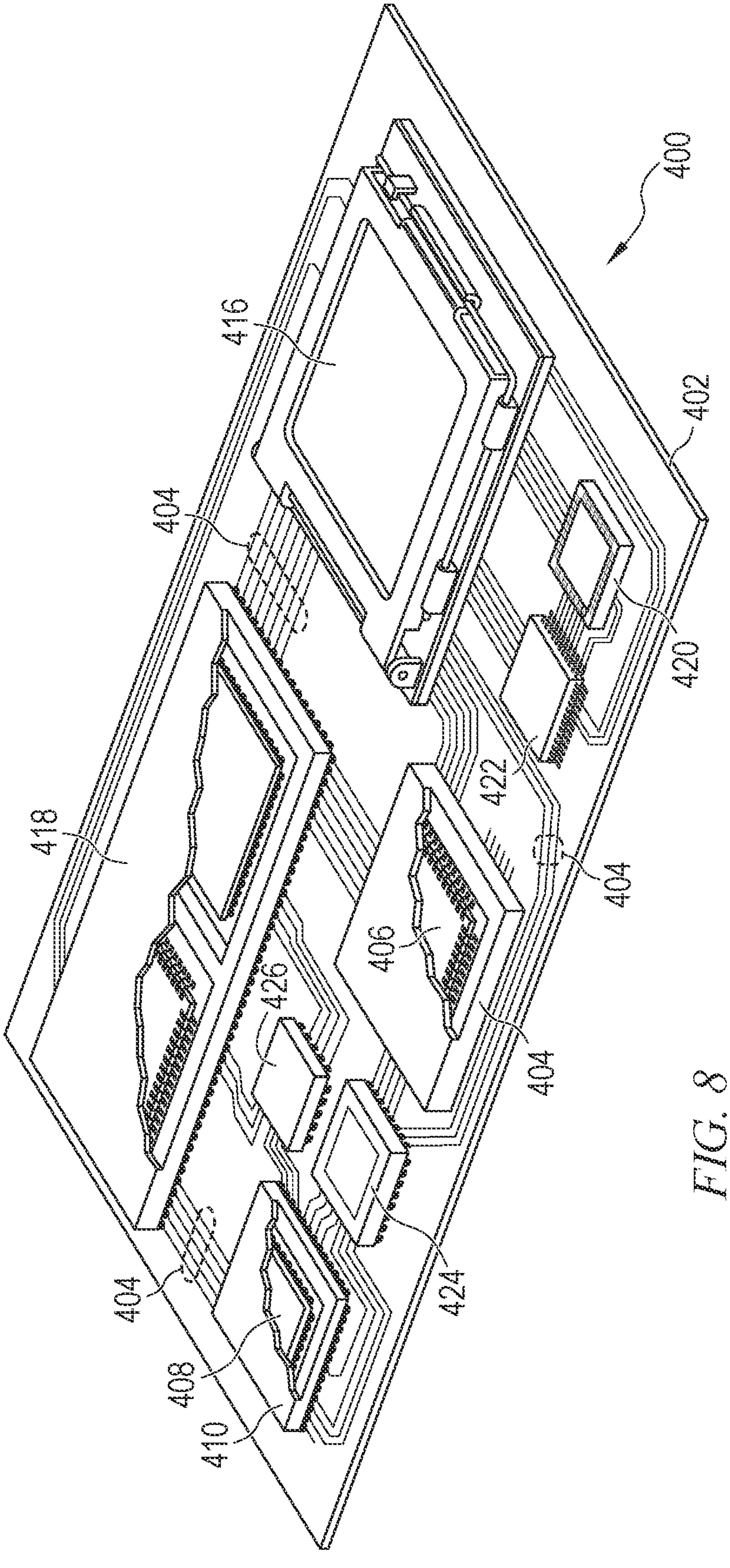
FIG. 8 illustrates a printed circuit board (PCB) with different types of packages disposed on a surface of the PCB.

FIG. 8 illustrates electrical device 400 having a chip carrier substrate or PCB 402 with a plurality of semiconductor packages disposed on a surface of PCB 402, including semiconductor packages 185, 190, 195, 200, 241, and 250. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

forming a first vertical interconnect structure by,
- providing a first substrate,
- mounting a first conductive post to the first substrate with a first bonding material, and
- depositing a first encapsulant over the first substrate, first bonding material, and first conductive post;

forming a second vertical interconnect structure by,
- providing a second substrate,
- mounting a second conductive post to the second substrate with a second bonding material, and
- depositing a second encapsulant over the second substrate, second bonding material, and second conductive post;

disposing the first vertical interconnect structure and second interconnect structure over a third substrate;

disposing an electrical component over the third substrate between the first vertical interconnect structure and second vertical interconnect structure; and depositing a third encapsulant over the first vertical interconnect structure, second vertical interconnect structure, and electrical component.

2. The method of claim 1, further including removing a portion of the third encapsulant to expose a surface of the first vertical interconnect structure.

3. The method of claim 1, further including removing the first substrate and first bonding material to expose a surface of the first conductive post.

4. The method of claim 1, further including removing a portion of the first encapsulant to expose the first conductive post.

5. The method of claim 1, further including forming the first vertical interconnect structure by:

mounting a third conductive post to the first conductive post using a third bonding material; and depositing the first encapsulant over the first conductive post and third conductive post.

6. The method of claim 1, further including backgrinding the third encapsulant to remove the first substrate and second substrate.

7. A semiconductor device, comprising:

a first vertical interconnect structure including, a first substrate, a first conductive post mounted to the first substrate with a first bonding material, and a first encapsulant deposited over the first substrate, first bonding material, and first conductive post;

a second vertical interconnect structure including, a second substrate, a second conductive post mounted to the second substrate with a second bonding material, and a second encapsulant deposited over the second substrate, second bonding material, and second conductive post;

a third substrate disposed under the first vertical interconnect structure and second interconnect structure;

an electrical component disposed over the third substrate between the first vertical interconnect structure and second vertical interconnect structure; and a third encapsulant deposited over the first vertical interconnect structure, second vertical interconnect structure, and electrical component.

8. The semiconductor device of claim 7, wherein a surface of the first vertical interconnect structure is planar with a surface of the third encapsulant.

9. The semiconductor device of claim 7, wherein the first vertical interconnect structure includes a plurality of stacked vertical conductive posts.

10. The semiconductor device of claim 7, further including a build-up interconnect structure formed over the first vertical interconnect structure.

* * * * *